United States Patent
Kim (10) Patent No.: US 11,508,652 B2
(45) Date of Patent: Nov. 22, 2022

(54) SEMICONDUCTOR PACKAGE

(71) Applicant: Samsung Electronics Co., Ltd., Suwon-si (KR)

(72) Inventor: Chulwoo Kim, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 56 days.

(21) Appl. No.: 17/109,925

(22) Filed: Dec. 2, 2020

(65) Prior Publication Data

US 2021/0366818 A1   Nov. 25, 2021

(30) Foreign Application Priority Data

May 20, 2020   (KR) .................. 10-2020-0060338

(51) Int. Cl.
  *H01L 23/48* (2006.01)
  *H01L 23/52* (2006.01)
  *H01L 29/40* (2006.01)
  *H01L 23/498* (2006.01)

(52) U.S. Cl.
  CPC .. *H01L 23/49838* (2013.01); *H01L 23/49827* (2013.01)

(58) Field of Classification Search
  CPC combination set(s) only.
  See application file for complete search history.

(56) References Cited

U.S. PATENT DOCUMENTS

| | | |
|---|---|---|
| 5,818,113 A | 10/1998 | Iseki et al. |
| RE43,404 E | 5/2012 | Distefano et al. |
| 9,397,236 B2 | 7/2016 | Camacho et al. |
| 9,607,863 B1 | 3/2017 | Lee |
| 9,798,088 B2 | 10/2017 | Gambino et al. |
| 2011/0260338 A1* | 10/2011 | Lee .......................... H01L 21/50 257/E21.511 |
| 2013/0154085 A1* | 6/2013 | Choi ....................... H01L 23/36 438/122 |
| 2014/0011315 A1 | 1/2014 | Camacho et al. |
| 2017/0131476 A1 | 5/2017 | Gambino et al. |

FOREIGN PATENT DOCUMENTS

| | | |
|---|---|---|
| JP | 3475575 B2 | 9/2003 |
| JP | 2005121632 A | 5/2005 |
| JP | 2006211612 A | 8/2006 |
| KR | 20110091158 A | 8/2011 |
| KR | 101099582 B1 | 12/2011 |

* cited by examiner

*Primary Examiner* — Niki H Nguyen
(74) *Attorney, Agent, or Firm* — Myers Bigel, P.A.

(57) ABSTRACT

A semiconductor package includes a package substrate, a semiconductor chip on the package substrate, and a plurality of underfills between the package substrate and the semiconductor chip. The package substrate includes a trench formed in the package substrate and a plurality of dams on both sides of the trench, respectively. The top surfaces of the plurality of dams may be positioned at a lower level than the bottom surface of the semiconductor chip in a cross-sectional view of the semiconductor package with the package substrate providing a base reference level.

19 Claims, 10 Drawing Sheets

SEMICONDUCTOR PACKAGE

CROSS-REFERENCE TO THE RELATED APPLICATION

This application claims priority from Korean Patent Application No. 10-2020-0060338, filed on May 20, 2020, in the Korean Intellectual Property Office, the disclosure of which is incorporated herein by reference in its entirety.

BACKGROUND

1. Field

The inventive concept relates to a semiconductor package, and, more particularly, to a semiconductor package including a dam and a trench configured to divide an underfill into sections.

2. Description of the Related Art

In a semiconductor package, the space between a semiconductor chip or a silicon interposer and a package substrate may contain a filling material, such as an underfill. In a conventional large-size package, such as a 2.5D semiconductor package, it may take a long time to fill the space with a filling material from an edge portion, and there may be a high risk of voids, such as bubbles, being trapped in the filling material. When voids are present in the filling material, a short circuit may develop between adjacent solder bumps due to moisture absorption.

SUMMARY

Example embodiments of the inventive concept provide a semiconductor package including a dam and a trench disposed on a package substrate that are configured to divide an underfill into discontinuous sections, thereby shortening the flow time taken to charge the underfill and inhibiting or preventing voids from being trapped in the underfill.

A semiconductor package in accordance with an example embodiment of the inventive concept may include a package substrate, a semiconductor chip on the package substrate, and a plurality of underfills between the package substrate and the semiconductor chip. The package substrate may include a trench formed in the package substrate and a plurality of dams on both sides of the trench, respectively. The top surfaces of the plurality of dams may be positioned at a lower level than the bottom surface of the semiconductor chip in a cross-sectional view of the semiconductor package with the package substrate providing a base reference level.

A semiconductor package in accordance with an example embodiment of the inventive concept may include a package substrate, a semiconductor chip on the package substrate, and a plurality of underfills between the package substrate and the semiconductor chip. The package substrate may include a dam thereon. The top surface of the dam may be positioned at a lower level than the bottom surface of the semiconductor chip in a cross-sectional view of the semiconductor package with the package substrate providing a base reference level.

A semiconductor package in accordance with an example embodiment of the inventive concept may include a package substrate, a semiconductor chip on the package substrate, and a plurality of underfills between the package substrate and the semiconductor chip. The package substrate may include a trench formed in the package substrate.

DETAILED DESCRIPTION OF EXAMPLE EMBODIMENTS

Hereinafter, embodiments of the inventive concept will be described in detail with reference to the accompanying drawings. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIGS. 1 to 6 are top or plan views illustrating a package substrate 100 according to various example embodiments of the present inventive concept.

In a top view, the package substrate 100 (for convenience, package substrate 100 may be used to refer to any of package substrates 100A, 100B, 100C, 100D, 100E, and 100F) may include a chip region 250, in which a semiconductor chip 200 is disposed. The semiconductor chip 200 or a semiconductor stack including a plurality of semiconductor chips may be mounted on the chip region 250 of the package substrate 100. The package substrate 100 may connect the semiconductor chip 200 to an external circuit, may protect the semiconductor chip 200 from external impacts, and may provide support for the semiconductor chip 200. For example, the package substrate 100 may include a printed circuit board (PCB).

Referring to FIGS. 1 to 6, the package substrate 100 may include a dam 110 and a trench 150 disposed thereon. The dam 110 may protrude upwards from the top surface of the package substrate 100. The dam 110 may be configured to divide an underfill 300, which is provided between the package substrate 100 and the semiconductor chip 200, into discontinuous sections on the package substrate 100. The material of the dam 110 may include a solder resist material, an insulation material, a polymer, a metal, and/or any other appropriate barrier material. The dam 110 may be formed through screen printing, electrolytic plating, electroless plating, spray coating, and/or an appropriate deposition process based on the material thereof The dam 110 may be manufactured integrally with the package substrate 100, such that the dam 110 and the package substrate comprise a monolithic structure, or may be manufactured separately and attached to the package substrate 100.

The trench 150 may be recessed downwards from the top surface of the package substrate 100. The trench 150 may be configured to divide the underfill 300, which is provided between the package substrate 100 and the semiconductor chip 200, into discontinuous sections independently or together with the dam 110 on the package substrate 100. The trench 150 may have a depth within a range that does not cause damage to circuits in the package substrate 100. In some embodiments, the depth of the trench 150 may be less than the vertical distance from the top surface of the package substrate 100 to a portion in the package substrate 100 at which a wiring layer is located. That is, the depth of the trench 150 may be less than the thickness of an insulating layer on or at least partially covering the wiring layer of the package substrate 100.

The package substrate 100 may selectively include the dam 110 protruding upwards therefrom and the trench 150 may be recessed downwards therein, or may include both the dam 110 and the trench 150. That is, the dam 110 may not necessarily be formed on both sides of the trench 150 and may, in various embodiments, be formed only on one side of the trench or the other.

To effectively divide the underfill 300, the length of the trench 150 may be greater than the width of the chip region 250, which is the region in which the semiconductor chip 200 is disposed on the package substrate 100. When the trench 150 extends to the outside of the chip region 250 in a top or plan view, the air pushed in the process of charging the underfill 300 may be more easily discharged to the outside of the semiconductor package 10 (see FIG. 7) through the trench 150.

Figure 1:
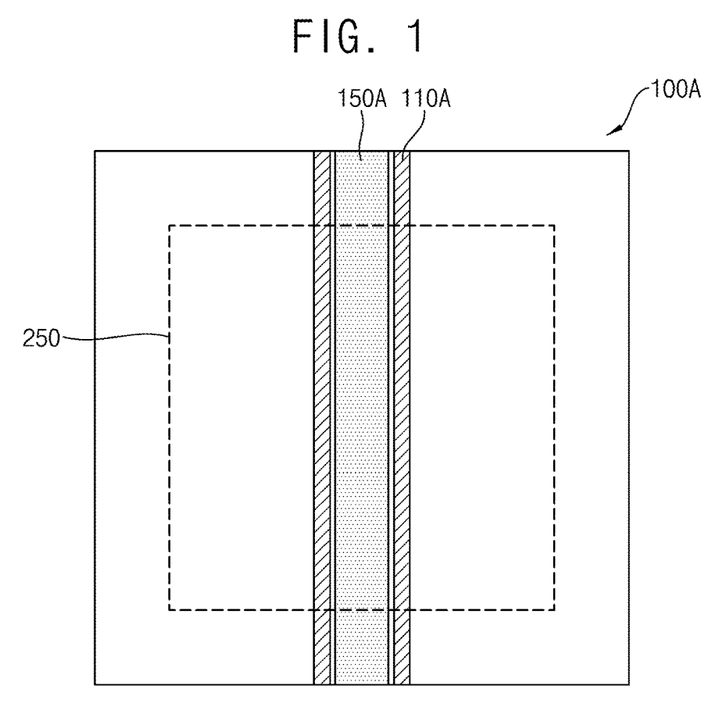
FIGS. 1 to 6 are plan views illustrating a package substrate according to various example embodiments of the present inventive concept.

Referring to FIG. 1, a package substrate 100A may include a trench 150A formed in the top surface thereof and a plurality of dams 110A disposed on both sides of the trench 150A. The dams 110A and the trench 150A may have a bar shape or a line shape. The lengths of the dams 110A and the trench 150A may be the same as the length of one side of the package substrate 100A. In some embodiments, a semiconductor package may include the package substrate 100A of FIG. 1 and the underfill 300 may be divided into two discontinuous sections. The underfill 300 may be charged along the edge of the chip region 250. The underfill 300 may be blocked by the dams 110A, and thus may not flow into the trench 150A, and the air pushed in the process of charging the underfill 300 may be discharged to the outside of the chip region 250 in an upward-downward direction through the trench 150A.

Figure 2:
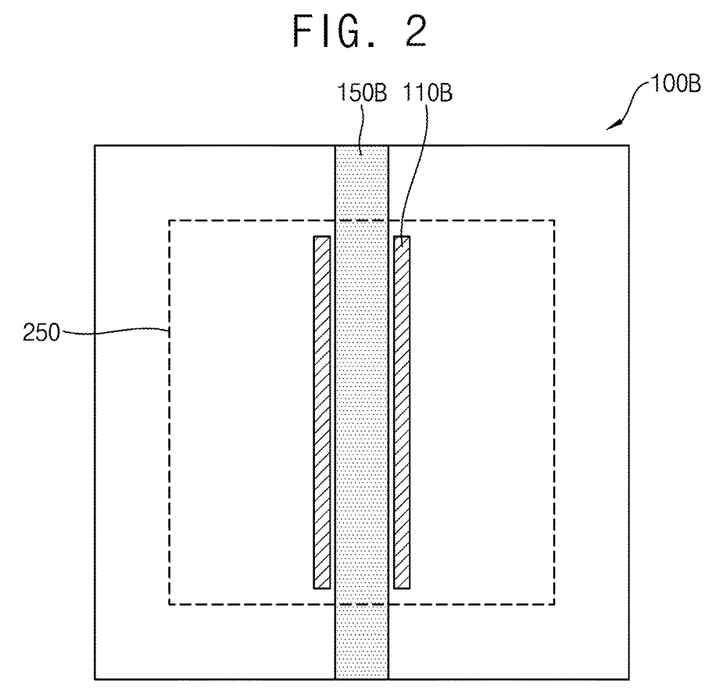

Referring to FIG. 2, the length of a trench 150B may be the same as the length of one side of a package substrate 100B. In a top or plan view, the lengths of bar-shaped dams 110B disposed on both sides of the trench 150B may be less than the width of the chip region 250 in which the semiconductor chip 200 is disposed. In an example embodiment, even when the lengths of the dams 110B are less than the width of the chip region 250, the underfill 300 may be divided into discontinuous sections based on the amount of underfill 300. In an example embodiment, when the lengths of the dams 110B are less than the width of the chip region 250, a heat slug 400 (see FIG. 20) may be more easily attached to the package substrate 100B.

Figure 3:
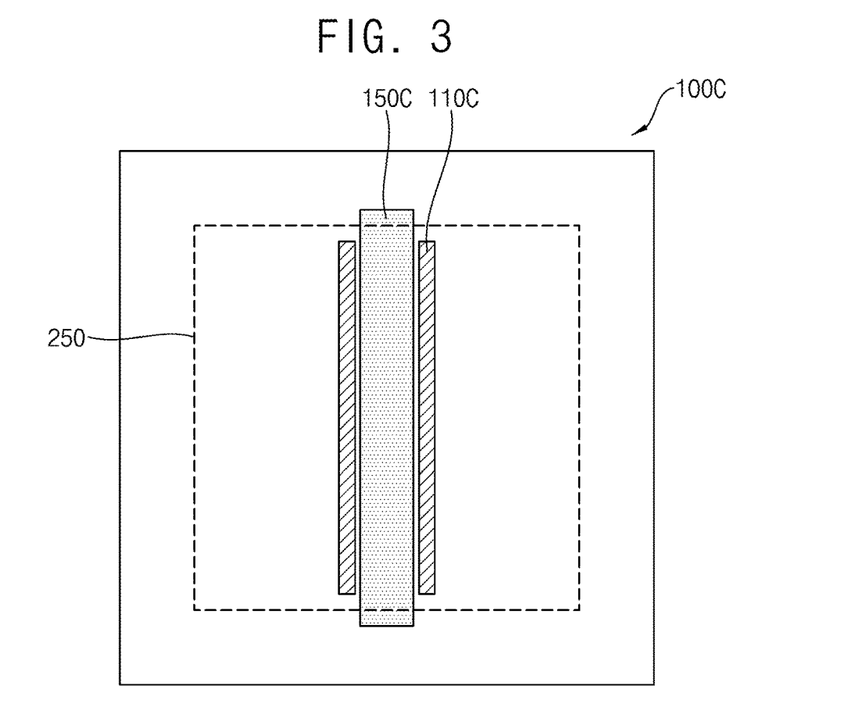

Referring to FIG. 3, the length of a trench 150C may be greater than the length of one side of the chip region 250. When the length of the trench 150C extends to the outside of the chip region 250, the air pushed in the process of charging the underfill 300 may be more easily discharged to the outside of the semiconductor package 10 (see FIG. 7) through the trench 150C.

Figure 4:
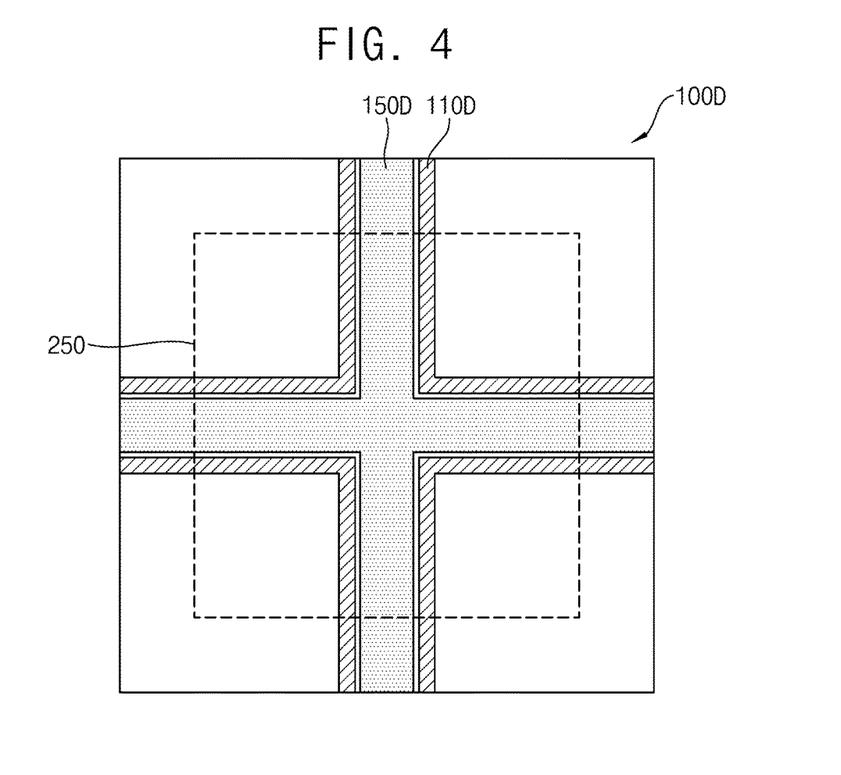

Referring to FIG. 4, a package substrate 100D may include one trench 150D and four dams 110D bordering or surrounding the trench 150D. The trench 150D may have a cross shape, and each of the four dams 110D may have an elbow shape according to various embodiments of the inventive concept. When a semiconductor package includes the package substrate 100D of FIG. 4, the underfill 300 may be divided into four discontinuous sections. The underfill 300 may be charged along the edge of the chip region 250. The underfill 300 may be inhibited or blocked by the dams 110D, and thus may not flow into the trench 150D, and the air pushed in the process of charging the underfill 300 may be discharged to the outside of the chip region 250 in an upward-downward direction and a leftward-rightward direction through the trench 150D in the plan view of FIG. 4.

Figure 5:
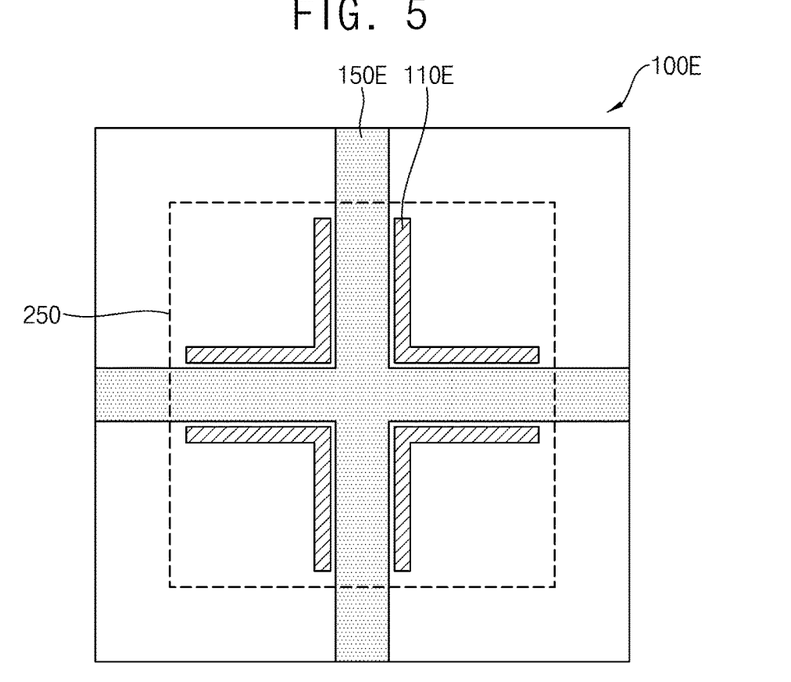

Referring to FIG. 5, the end of a trench 150E may extend to the edge of a package substrate 100E. In a top or plan view, elbow-shaped dams 110E disposed on both sides of the trench 150E may be positioned within the chip region 250 in which the semiconductor chip 200 is disposed. In an example embodiment, even when the dams 110E are positioned within the chip region 250, the underfill 300 may be divided into discontinuous sections based on the amount of underfill 300. In an example embodiment, when the dams 110E are positioned within the chip region 250, a heat slug 400 (see FIG. 20) may be more easily attached to the package substrate 100E.

Figure 6:
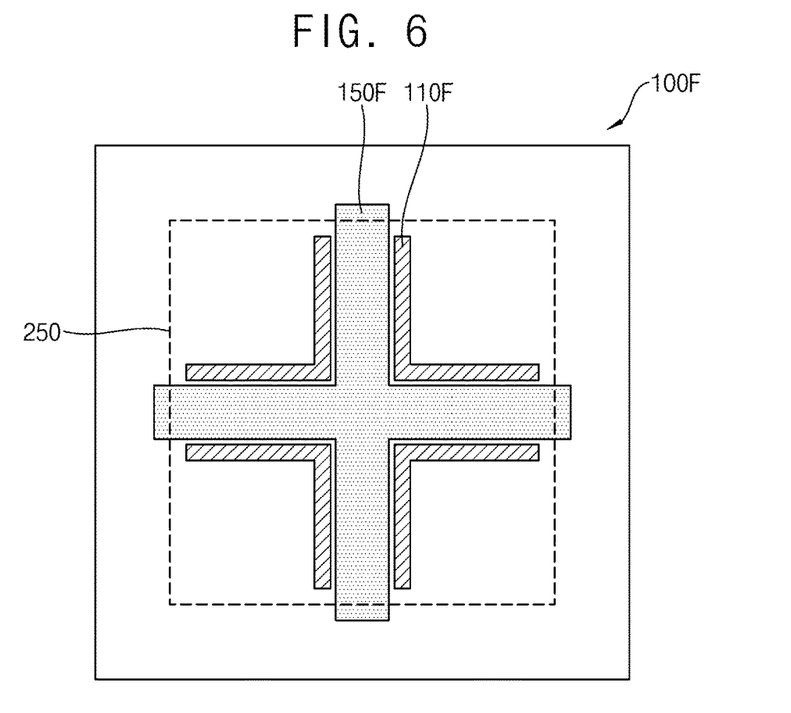

Referring to FIG. 6, the length of a trench 150F may extend to the outside of the chip region 250. When the length of the trench 150F extends to the outside of the chip region 250, the air pushed in the process of charging the underfill 300 may be more easily discharged to the outside of the semiconductor package 10 (see FIG. 7) through the trench 150F.

Figure 7:
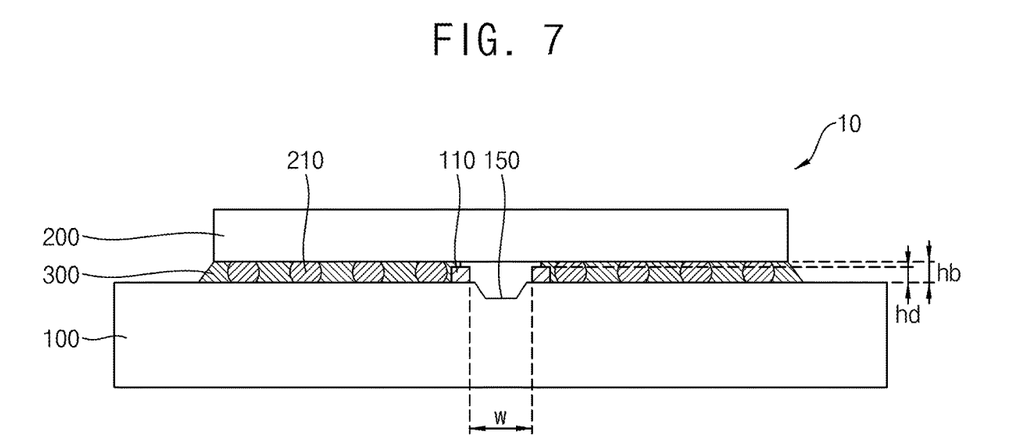
FIG. 7 is a side-sectional view of a semiconductor package according to an example embodiment of the present inventive concept.

FIG. 7 is a side-sectional view of a semiconductor package 10 according to an example embodiment of the present inventive concept. Referring to FIG. 7, the semiconductor package 10 may include a package substrate 100, a semiconductor chip 200, and an underfill 300, and the package substrate 100 may include a trench 150 and a plurality of dams 110.

The semiconductor chip 200 may be disposed on the package substrate 100. The semiconductor chip 200 may include a memory chip, a logic chip, and/or a silicon interposer. The semiconductor chip 200 may be any type of semiconductor that requires packaging, such as, but not limited to, a single semiconductor chip, a 2.1D semiconductor device, a 2.5D semiconductor device, or a 3D semiconductor device.

The underfill 300 may be disposed between the package substrate 100 and the semiconductor chip 200. The underfill 300 may insulate between bumps 210 disposed under the semiconductor chip 200, and may support the semiconductor chip 200 on the package substrate 100. The underfill 300 may be divided into a plurality of discontinuous sections.

Referring to FIG. 7, the top surfaces of the dams 110 may be positioned at a lower level than the bottom surface of the semiconductor chip 200. That is, the heights hd of the dams 110 may be less than the heights hb of the bumps 210. When the top surfaces of the dams 110 are positioned at a lower level than the bottom surface of the semiconductor chip 200 in the cross-sectional view of FIG. 7, the air pushed in the process of charging the underfill 300 may be introduced into the trench 150 through the space between the dams 110 and the semiconductor chip 200. The air introduced into the trench 150 may be discharged to the outside of the semiconductor package 10 through the trench 150. In an example embodiment, the heights hb of the bumps 210 may be about 50 μm, and the heights hd of the dams 110 may be about 25 μm.

In an example embodiment, the diameters of the bumps 210 may be about 80 μm, the distance between adjacent bumps 210 may be about 70 μm, and the width w of the trench 150 may be 20 μm or more. The width of the trench 150 may not be influenced by the sizes of the bumps 210 or the distance between adjacent bumps 210, and may be determined so as to effectively discharge air.

Figure 10:
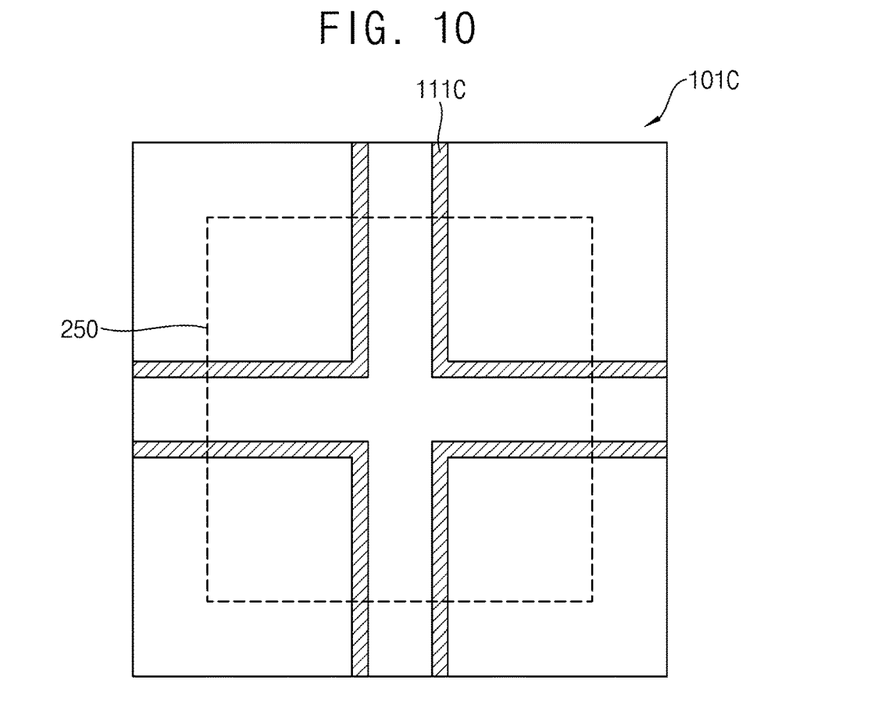
Figure 11:
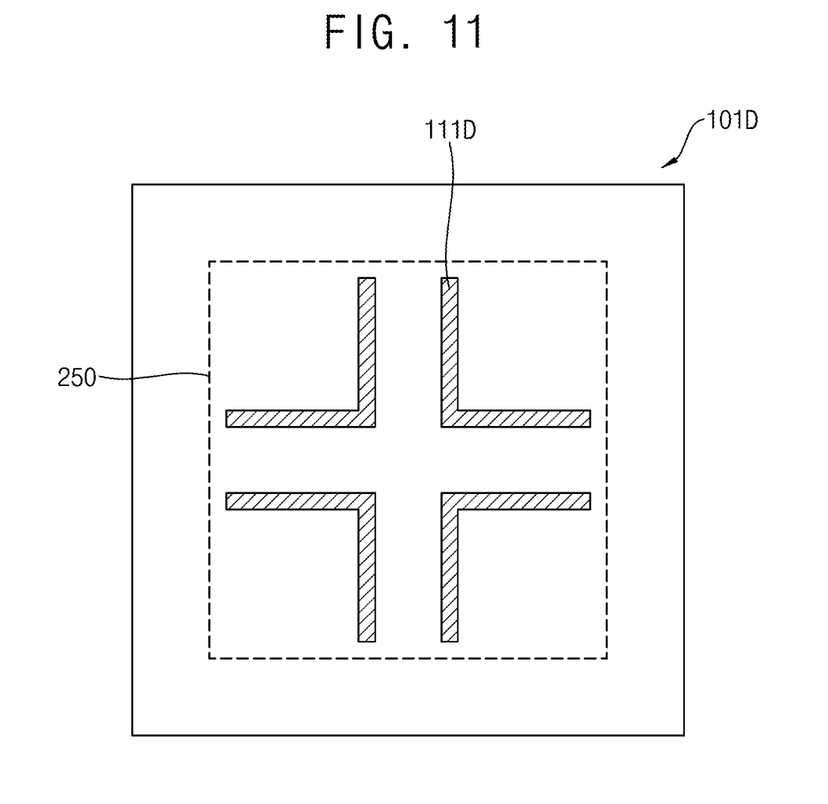
Figure 12:
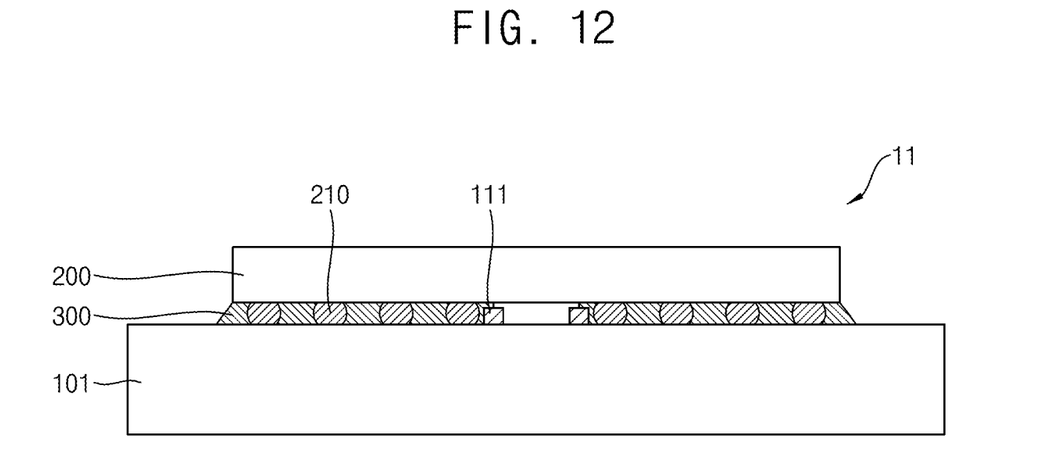
FIG. 12 is a side-sectional view of a semiconductor package according to an example embodiment of the present inventive concept.

FIGS. 8 to 11 are views illustrating a package substrate 101 according to various example embodiments of the present inventive concept, and FIG. 12 is a side-sectional view of a semiconductor package 11 according to an example embodiment of the present inventive concept.

Figure 8:
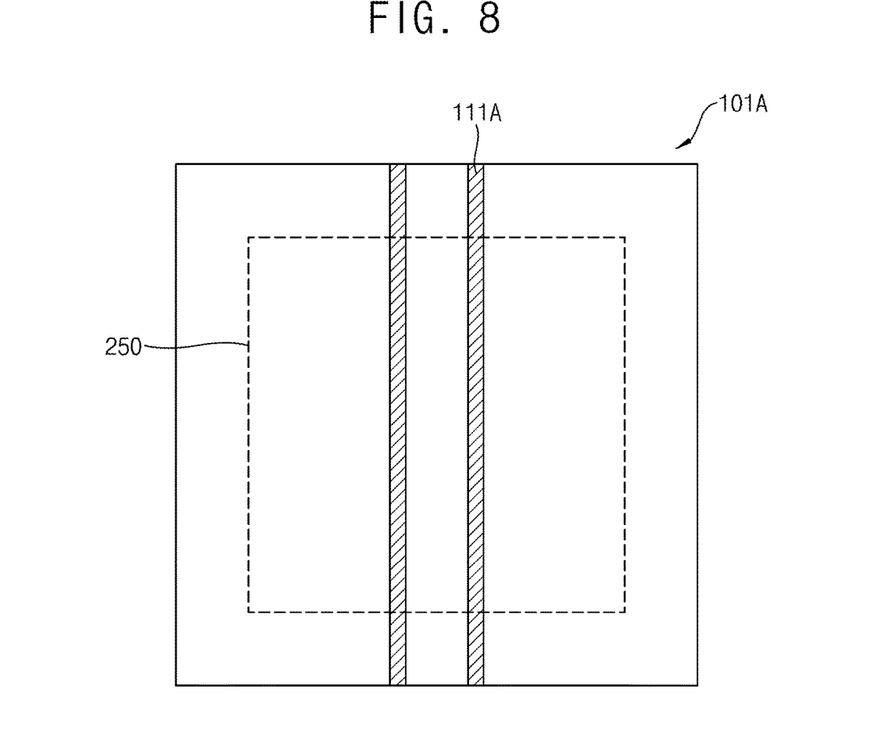
FIGS. 8 to 11 are plan views illustrating a package substrate according to various example embodiments of the present inventive concept.

Referring to FIG. 8, a package substrate 101A may include a dam disposed thereon. The dam may include a pair of dam units 111A disposed parallel to each other while being spaced apart from each other with a predetermined interval therebetween. Each of the dam units 111A may have a bar shape. The lengths of the dam units 111A may be the same as the length of one side of the package substrate 101A. A cavity may be formed between the pair of dam units 111A. When a semiconductor package includes the package substrate 101A of FIG. 8, the underfill 300 may be divided into two discontinuous sections. The underfill 300 may be charged along the edge of the chip region 250. The underfill 300 may be inhibited or blocked by the dam units 111A, and thus may not flow into the cavity between the pair of dam units 111A. The air pushed in the process of charging the underfill 300 may be discharged to the outside of the chip region 250 in an upward-downward direction through the cavity between the pair of dam units 111A in the top or plan view of FIG. 8.

Figure 9:
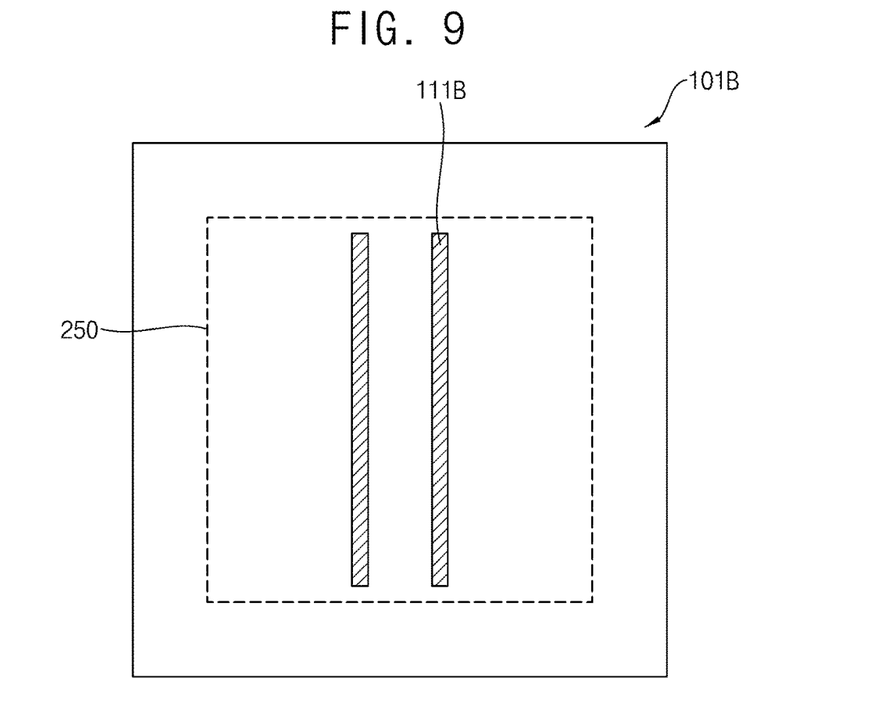

Referring to FIG. 9, in a top or plan view, a pair of dam units 111B disposed parallel to each other while being spaced apart from each other with a predetermined interval therebetween may be formed to be shorter than the width of the chip region 250 in which the semiconductor chip 200 is disposed. In an example embodiment, even when the lengths of the dam units 111B are less than the width of the chip region 250, the underfill 300 may be divided into discontinuous sections based on the amount of underfill 300. In an example embodiment, when the lengths of the dam units 111B are less than the width of the chip region 250, a heat slug 400 (see FIG. 20) may be more easily attached to the package substrate 101B.

Referring to FIG. 10, a package substrate 101C may include four dam units 111C, each having an elbow shape. One cross-shaped cavity may be formed between the four dam units 111C. When a semiconductor package includes the package substrate 101C of FIG. 10, the underfill 300 may be divided into four discontinuous sections. The underfill 300 may be inhibited or blocked by the dam units 111C, and thus may not flow into the cavity formed between the dam units 111C, and the air pushed in the process of charging the underfill 300 may be discharged to the outside of the chip region 250 in an upward-downward direction and a leftward-rightward direction through the cavity in the top or plan view of FIG. 10.

Referring to FIG. 11, in a top or plan view, each of the elbow-shaped dam units 111D may be positioned within the chip region 250 in which the semiconductor chip 200 is disposed. In an example embodiment, even when the dam units 111D are positioned within the chip region 250, the underfill 300 may be divided into discontinuous sections based on the amount of underfill 300. In an example embodiment, when the dam units 111D are positioned within the chip region 250, a heat slug 400 (see FIG. 20) may be more easily attached to the package substrate 101D.

Referring to FIG. 12, a semiconductor package 11 according to an example embodiment of the present inventive concept may include a package substrate 101, a semiconductor chip 200 disposed on the package substrate 101, and a plurality of underfills 300 disposed between the package substrate 101 and the semiconductor chip 200. The package substrate 101 may include dams 111 disposed thereon. The top surfaces of the dams 111 may be positioned at a lower level than the bottom surface of the semiconductor chip 200 in the cross-sectional view of FIG. 12. In such embodiments, the air pushed in the process of charging the underfill 300 may be introduced into a cavity formed by the plurality of dams 111 through the space between the dams 111 and the semiconductor chip 200. The air introduced into the cavity may be discharged to the outside of the semiconductor package 11.

Figure 15:
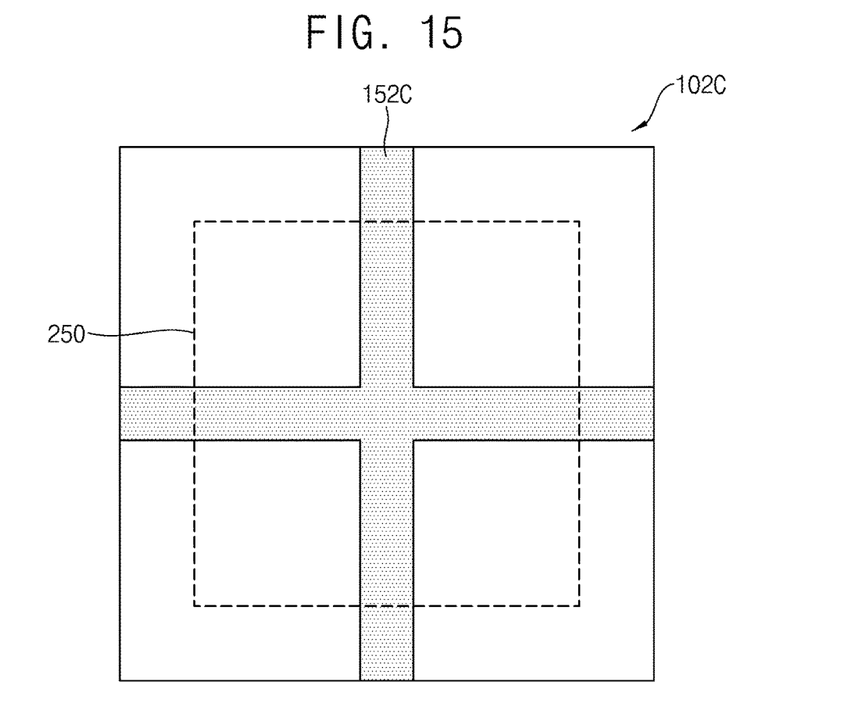
Figure 16:
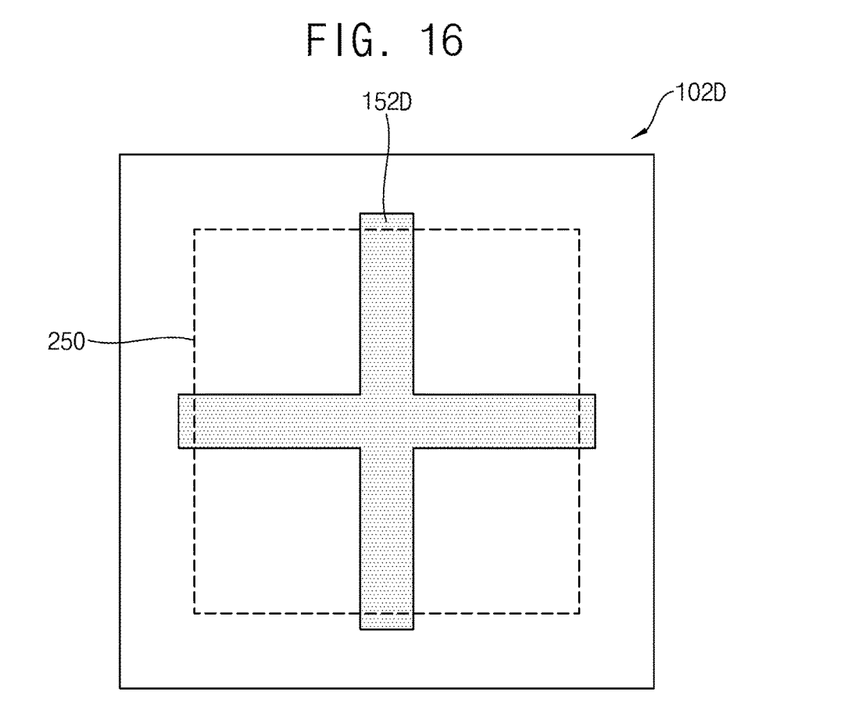
Figure 17:
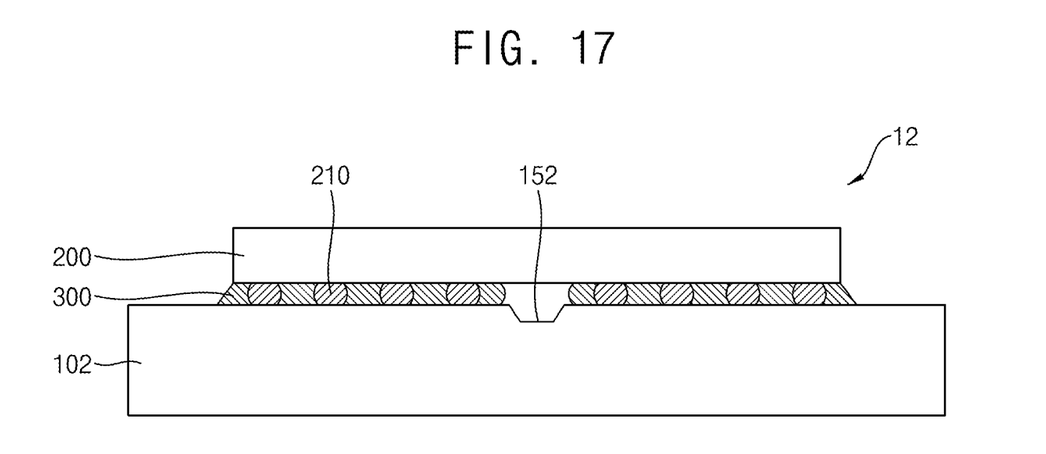
FIG. 17 is a side-sectional view of a semiconductor package according to an example embodiment of the present inventive concept.

FIGS. 13 to 16 are top or plan views illustrating a package substrate 102 (for convenience, package substrate 102 may be used to refer to any of package substrates 102A, 102B, 102C, and 102D) according to various example embodiments of the present inventive concept, and FIG. 17 is a side-sectional view of a semiconductor package 12 according to an example embodiment of the present inventive concept.

Figure 13:
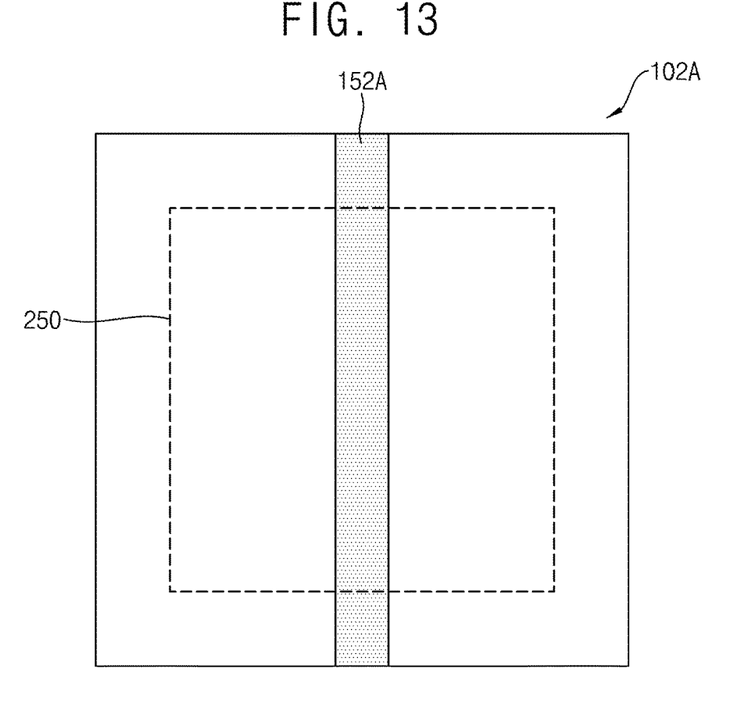
FIGS. 13 to 16 are plan views illustrating a package substrate according to various example embodiments of the present inventive concept.

Referring to FIG. 13, a package substrate 102A may include a trench 152A formed in the top surface thereof The trench 152A may have a bar shape or a line shape. The length of the trench 152A may be the same as the length of one side of the package substrate 102A. When a semiconductor package includes the package substrate 102A of FIG. 13, the underfill 300 may be divided into two discontinuous sections. The underfill 300 may be charged along the edge of the chip region 250. The amount of underfill 300 that is charged may be adjusted so that the underfill 300 is not introduced into the trench 152A. The air pushed in the process of charging the underfill 300 may be discharged to the outside of the chip region 250 in an upward-downward direction through the trench 152A in the top or plan view of FIG. 13.

Figure 14:
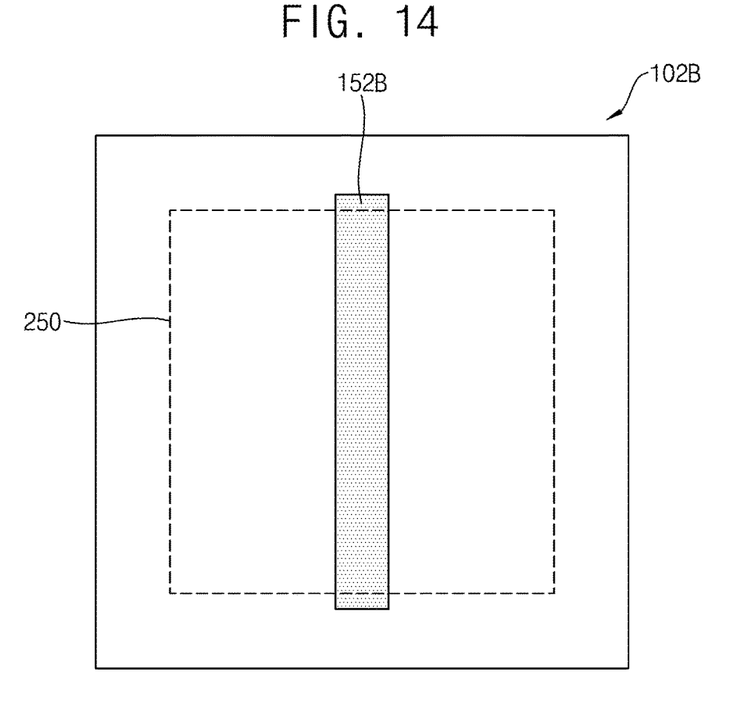

Referring to FIG. 14, the length of a trench 152B may be greater than the length of one side of the chip region 250.

When the length of the trench 152B extends to the outside of the chip region 250, the air pushed in the process of charging the underfill 300 may be more easily discharged to the outside of the semiconductor package through the trench 152B.

Referring to FIG. 15, a package substrate 102C may include a trench 152C having a cross shape. The end of the trench 152C may extend to the edge of the package substrate 102C. When a semiconductor package includes the package substrate 102C of FIG. 15, the underfill 300 may be divided into four discontinuous sections. The underfill 300 may be charged along the edge of the chip region 250. The amount of underfill 300 may be adjusted so that the underfill 300 is not introduced into the trench 152C. The air pushed in the process of charging the underfill 300 may be discharged to the outside of the chip region 250 in an upward-downward direction and a leftward-rightward direction through the trench 152C in the top or plan view of FIG. 15.

Referring to FIG. 16, the length of a trench 152D may extend to the outside of the chip region 250. When the length of the trench 152D extends to the outside of the chip region 250, the air pushed in the process of charging the underfill 300 may be more easily discharged to the outside of the semiconductor package through the trench 152D.

Referring to FIG. 17, a semiconductor package 12 according to an example embodiment of the present inventive concept may include a package substrate 102, a semiconductor chip 200 disposed on the package substrate 102, and a plurality of underfills 300 disposed between the package substrate 102 and the semiconductor chip 200. The package substrate 102 may include a trench 152 formed in the top surface thereof. The bottom surface of the trench 152 may be positioned at a lower level than the top surface of the package substrate 102 in the cross-sectional view of FIG. 17. In such embodiments, when an appropriate amount of underfill 300 is injected, the underfill 300 may not flow into the trench 152 due to capillary action. The air pushed in the process of charging the underfill 300 may be discharged to the outside of the semiconductor package 12 through the trench 152.

Figure 18:
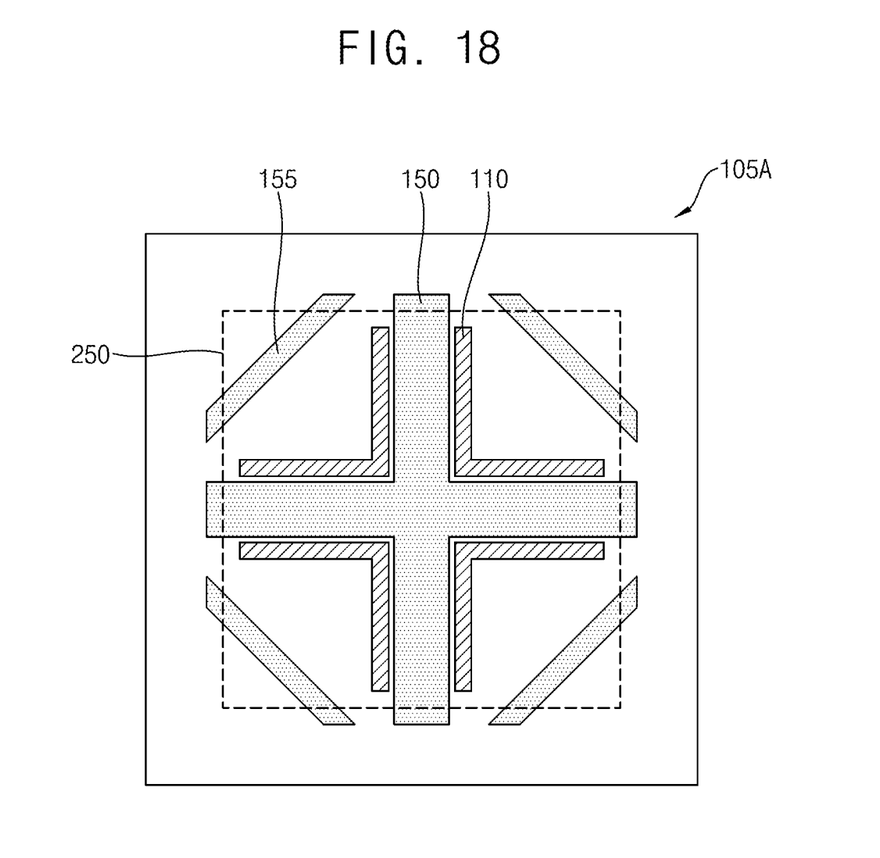
FIGS. 18 and 19 are plan views illustrating a package substrate according to various example embodiments of the present inventive concept.
Figure 19:
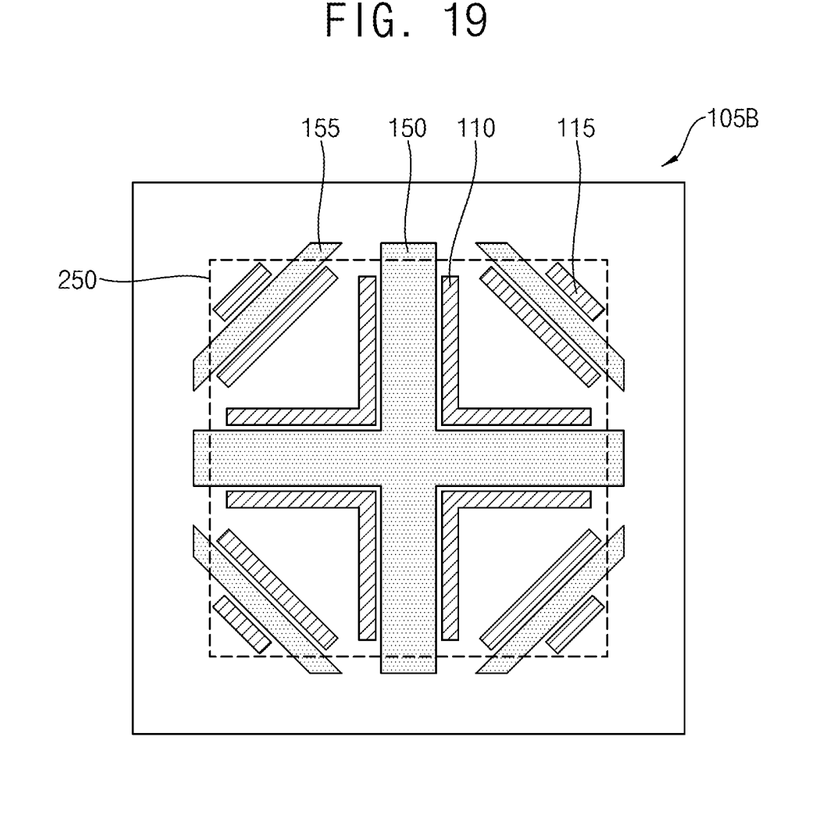

FIGS. 18 and 19 are top or plan views illustrating a package substrate 105 (for convenience, package substrate 105 may be used to refer to any of package substrates 105A and 105B) according to various example embodiments of the present inventive concept. In an example embodiment, in a top or plan view, the package substrate 105 may further include an edge dam 115 or an edge trench 155, which is disposed at the edge of the chip region 250 in which the semiconductor chip 200 is disposed.

Referring to FIG. 18, the package substrate 105A may include a trench 150 and a plurality of dams 110 disposed thereon, and may further include four edge trenches 155.

The edge trenches 155 may be disposed obliquely in the chip region 250. In a top or plan view, a portion of each of the edge trenches 155 may be positioned within the chip region 250, and the remaining portion thereof may be positioned outside the chip region 250. When a portion of each of the edge trenches 155 extends to the outside of the chip region 250, the air pushed in the process of charging the underfill 300 may be easily discharged to the outside of the semiconductor package through the edge trenches 155.

When a semiconductor package includes the package substrate 105A of FIG. 18, the underfill 300 may be divided into eight discontinuous sections. The underfill 300 may be charged in eight separate regions for the underfill 300 along the edge of the chip region 250. The air pushed in the process of charging the underfill 300 may be discharged to the outside of the chip region through the trench 150 or the edge trenches 155.

Referring to FIG. 19, a package substrate 105B may further include a plurality of edge dams 115 disposed adjacent to the edge trenches 155. Each of the edge dams 115 may have a bar shape or a line shape. In a top or plan view, the edge dams 115 may be positioned within the chip region 250 in which the semiconductor chip 200 is disposed. In a side-sectional view, the top surfaces of the edge dams 115 may be positioned at a lower level than the bottom surface of the semiconductor chip 200. The air pushed in the process of charging the underfill 300 may be introduced into the edge trenches 155 through the space between the edge dams 115 and the semiconductor chip 200. The air introduced into the edge trenches 155 may be discharged to the outside of the semiconductor package. In an example embodiment, the package substrate 105B may not include the edge trenches 155, but may include only the edge dams 115.

Figure 20:
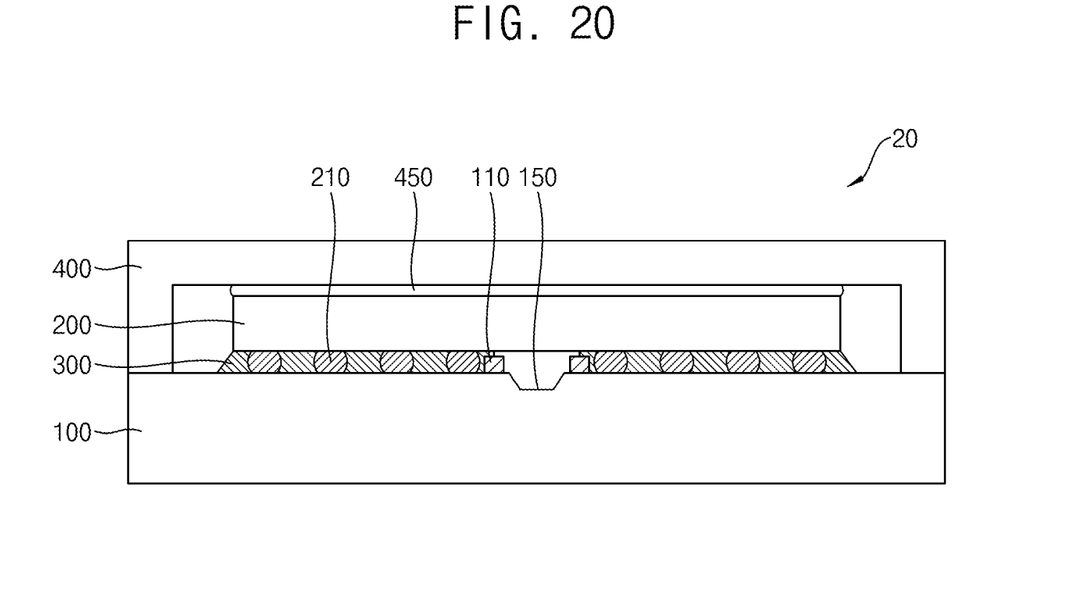
FIG. 20 is a side-sectional view of a semiconductor package according to an example embodiment of the present inventive concept.

FIG. 20 is a side-sectional view of a semiconductor package 20 according to an example embodiment of the present inventive concept. Referring to FIG. 20, the semiconductor package 20 may include a package substrate 100, a semiconductor chip 200, an underfill 300, a heat slug 400, and a thermal interface material (TIM) 450. The package substrate 100 may include a trench 150 and a plurality of dams 110.

The heat slug 400 may be disposed on the package substrate 100 so as to be on and to at least partially cover the semiconductor chip 200 mounted on the package substrate 100. The heat slug 400 is a component for dissipating the excessive amount of heat attributable to the high integration and high performance of the semiconductor chip 200. The heat slug 400 may include, as a base material, copper or a copper alloy having excellent thermal conductivity, with embodiments of the inventive concept not being limited thereto. The heat slug 400 may be attached to the package substrate 100 using an adhesive.

The thermal interface material (TIM) 450 may be disposed between the heat slug 400 and the semiconductor chip 200. The heat slug 400 may be in physical contact with the upper portion of the semiconductor chip 200 via the TIM 450. The TIM 450 may transfer the heat emitted from the semiconductor chip 200 to the heat slug 400, thereby enabling rapid dispersion and dissipation of the heat.

According to the embodiments of the present inventive concept, the package substrate 100 may include the dam 110 and the trench 150 having various shapes, whereby the underfill 300 may be divided into discontinuous sections. Due to the division of the underfill 300 into discontinuous sections, the flow time taken to charge the underfill 300 may be shortened. An air passage may be formed through the dam 110 and the trench 150 of the package substrate 100, which may reduce or prevent the occurrence of voids being trapped in the underfill 300. The reduction or elimination of voids being trapped in the underfill 300 may make it possible to reduce or prevent moisture absorption through voids, thus reducing the likelihood of or preventing the occurrence of a short circuit between adjacent bumps 210 attributable to moisture absorption.

Because the underfill 300 is divided into sections, the total amount of underfill 300 included in the semiconductor package may be reduced. The underfill 300 has a coefficient of expansion different from those of the package substrate 100 and the semiconductor chip 200. When the package is greatly deformed due to expansion and contraction of the underfill 300, a defect may occur, such as a non-wetting phenomenon, in which bonding portions of the solder bumps 210 are not adhered to the package substrate 100, or adjacent bumps 210 may be fused and connected to each other, leading to a short circuit. When the absolute amount of underfill 300 is reduced, the amount of stress applied to the semiconductor package due to expansion and contraction of the underfill 300 may be reduced, and deformation of the semiconductor package may be reduced or prevented.

As is apparent from the above description, according to the example embodiments of the inventive concept, a package substrate may include a dam and a trench to divide an underfill into discontinuous sections. Due to the division of the underfill into discontinuous sections, the flow time taken to charge the underfill may be shortened. An air passage may be formed through the dam and the trench of the package substrate, and the occurrence of voids trapped in the underfill may be reduced or prevented.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for the purposes of limitation.

What is claimed is:

1. A semiconductor package comprising:
a package substrate;
a semiconductor chip on the package substrate; and
a plurality of underfills between the package substrate and the semiconductor chip,
wherein the package substrate comprises:
a trench formed in the package substrate; and
a plurality of dams on both sides of the trench, respectively,
wherein top surfaces of the plurality of dams are positioned at a lower level than a bottom surface of the semiconductor chip in a cross-sectional view of the semiconductor package with the package substrate providing a base reference level, and vwherein in a plan view, the trench extends outside of a chip region of the package substrate from a center region of the chip region, the semiconductor chip being on the chip region.

2. The semiconductor package of claim 1, wherein each of the plurality of dams and the trench have a bar shape.

3. The semiconductor package of claim 2, wherein, in a plan view of the semiconductor package, respective lengths of the plurality of dams are each less than a width of the chip region of the package substrate.

4. The semiconductor package of claim 2, wherein, in a plan view, a length of the trench is greater than a width of the chip region of the package substrate.

5. The semiconductor package of claim 1, wherein the trench has a cross shape, and
wherein each of the plurality of dams has an elbow shape.

6. The semiconductor package of claim 5, wherein, in a plan view, the plurality of dams is positioned within the chip region of the package substrate.

7. The semiconductor package of claim 1, wherein the package substrate further comprises:
an edge trench at an edge of the chip region of the package substate, the semiconductor chip being on the chip region.

8. The semiconductor package of claim 7, wherein the package substrate further comprises:
edge dams on both sides of the edge trench.

9. The semiconductor package of claim 1, wherein the trench has a width of 20 μm or more.

10. The semiconductor package of claim 1, further comprising:
a heat slug on the package substrate and on the semiconductor chip; and
a thermal interface material disposed between the heat slug and the semiconductor chip.

11. A semiconductor package comprising:
a package substrate;
a semiconductor chip on the package substrate; and
a plurality of underfills between the package substrate and the semiconductor chip,
wherein the package substrate comprises a dam thereon,
wherein a top surface of the dam is positioned at a lower level than a bottom surface of the semiconductor chip in a cross-sectional view of the semiconductor package with the package substrate providing a base reference level, and
wherein in a plan view, the dam extends towards a side of a chip region of the package substrate from a center region of the chip region, the semiconductor chip being on the chip region.

12. The semiconductor package of claim 11, wherein the dam comprises a pair of dam units positioned parallel to each other while being spaced apart from each other with an interval therebetween, and wherein each of the pair of dam units has a bar shape.

13. The semiconductor package of claim 11, wherein the dam comprises four dam units, and
wherein each of the dam units has an elbow shape.

14. The semiconductor package of claim 11, wherein the package substrate further comprises:
an edge trench at an edge of the chip region of the package substrate.

15. The semiconductor package of claim 14, wherein the package substrate further comprises:
edge dams on both sides of the edge trench, respectively.

16. A semiconductor package comprising:
a package substrate;
a semiconductor chip on the package substrate; and
a plurality of underfills between the package substrate and the semiconductor chip,
wherein the package substrate comprises a trench formed in the package substrates; and
wherein in a plan view, the trench extends outside of a chip region of the package substrate from a center region of the chip region, the semiconductor chip being on the chip region.

17. The semiconductor package of claim 16, wherein the trench has a bar shape.

18. The semiconductor package of claim 16, wherein the trench has a cross shape.

19. The semiconductor package of claim 16, wherein the package substrate further comprises:
an edge trench at an edge of the chip region of the package substrate.

* * * * *